(12) United States Patent  
Barnette et al.

(10) Patent No.: US 9,362,901 B2  
(45) Date of Patent: Jun. 7, 2016

(54) CONTROLLING TURN ON FETS OF A HOT PLUG DEVICE

(71) Applicant: International Business Machines Corporation, Armonk, NY (US)

(72) Inventors: Jamaica L. Barnette, Durham, NC (US); Nicholas Celenza, Durham, NC (US); Brian C. Totten, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/831,345

(22) Filed: Aug. 20, 2015

(65) Prior Publication Data

US 2015/0358012 A1     Dec. 10, 2015

Related U.S. Application Data

(63) Continuation of application No. 14/256,120, filed on Apr. 18, 2014.

(51) Int. Cl.

| | |
|---|---|
| *H02H 7/20* | (2006.01) |
| *H03K 17/08* | (2006.01) |
| *H03K 17/693* | (2006.01) |
| *G06F 13/40* | (2006.01) |
| *H03K 17/687* | (2006.01) |
| *H02H 9/00* | (2006.01) |
| *G05F 1/569* | (2006.01) |

(52) U.S. Cl.
CPC ............ *H03K 17/08* (2013.01); *G06F 13/4081* (2013.01); *H02H 7/205* (2013.01); *H02H 9/004* (2013.01); *H03K 17/687* (2013.01); *H03K 17/693* (2013.01); *G05F 1/569* (2013.01); *G06F 13/40* (2013.01); *H02H 7/20* (2013.01)

(58) Field of Classification Search
CPC ....... H03K 17/693; H02H 7/205; H02H 7/20; G05F 1/569; G06F 13/4081; G06F 13/40
See application file for complete search history.

(56) References Cited

U.S. PATENT DOCUMENTS

| | | |
|---|---|---|
| 4,521,726 A | 6/1985 | Budnik |
| 4,598,332 A | 7/1986 | Kemeny |
| 5,831,346 A | 11/1998 | Baumann et al. |
| 6,084,454 A | 7/2000 | Holst |
| 7,414,335 B2 | 8/2008 | Hussein et al. |
| 7,906,950 B2 | 3/2011 | Bandholz et al. |
| 8,299,767 B1 | 10/2012 | Tuozzolo et al. |
| 8,400,862 B2 | 3/2013 | Tejada |
| 2003/0042795 A1 | 3/2003 | Veendrick et al. |
| 2012/0198136 A1 | 8/2012 | Moshayedi et al. |
| 2012/0229100 A1 | 9/2012 | Trenchs et al. |
| 2013/0033236 A1 | 2/2013 | Li et al. |
| 2013/0100561 A1 | 4/2013 | Senouci et al. |

OTHER PUBLICATIONS

"USPTO Notice of Allowance U.S. Appl. No. 14/256,120", Mail date: Dec. 18, 2015, 14 pages.

*Primary Examiner* — Caleb Henry  
*Assistant Examiner* — Alexander Belousov  
(74) *Attorney, Agent, or Firm* — Jeffrey L. Streets

(57) ABSTRACT

A method for controlling the in-rush current to a hot plug device. The method includes providing a series of turn on pulses to the gates of a plurality of turn on FETs on a hot plug device coupled to a direct current power source, wherein each pulse causes the plurality of FETs to pass current from the direct current power source to a subsystem of the hot plug device, and wherein each pulse has a duration that ends before the impedance of the turn on FETs falls below a safe operating region. The method further includes providing a steady turn on signal to the FETs in response to the output voltage from the FETs to a subsystem of the hot plug device exceeding a predetermined voltage threshold.

16 Claims, 3 Drawing Sheets

CONTROLLING TURN ON FETS OF A HOT PLUG DEVICE

CROSS-REFERENCE TO RELATED APPLICATIONS

This application is a continuation of U.S. patent application Ser. No. 14/256,120 filed on Apr. 18, 2014, which application is incorporated by reference herein.

BACKGROUND

1. Field of the Invention

The present invention relates to hot plug devices and methods of controlling power to a hot plug device.

2. Background of the Related Art

Many systems require the ability to hot plug a device into the system, and control the in-rush current seen by the charging of input capacitance. In most technologies there is a balance between charging the capacitance as fast as you can so the FETs are not in a linear mode too long, and not tripping the over current of the regulator or any other upstream power supply. The main issue seen in industry is the fact there is an impedance that is lower than the over current trip point, but high enough to damage a FET if turned on into this impedance. This exposes hot plug mechanisms to cases where, if there is a failure on the rail and the impedance is a soft short, it can lead to severe power dissipation in the turn on FETs, and can lead to a double fault causing a severe burn in a server environment.

BRIEF SUMMARY

One embodiment of the present invention provides a method, comprising providing a series of turn on pulses to the gates of a plurality of turn on FETs on a hot plug device coupled to a direct current power source, wherein each pulse causes the plurality of FETs to pass current from the direct current power source to a subsystem of the hot plug device, and wherein each pulse has a duration that ends before the impedance of the turn on FETs falls below a safe operating region. The method further comprises providing a steady turn on signal to the FETs in response to the output voltage from the FETs to a subsystem of the hot plug device exceeding a predetermined voltage threshold.

DETAILED DESCRIPTION

Figure 1:
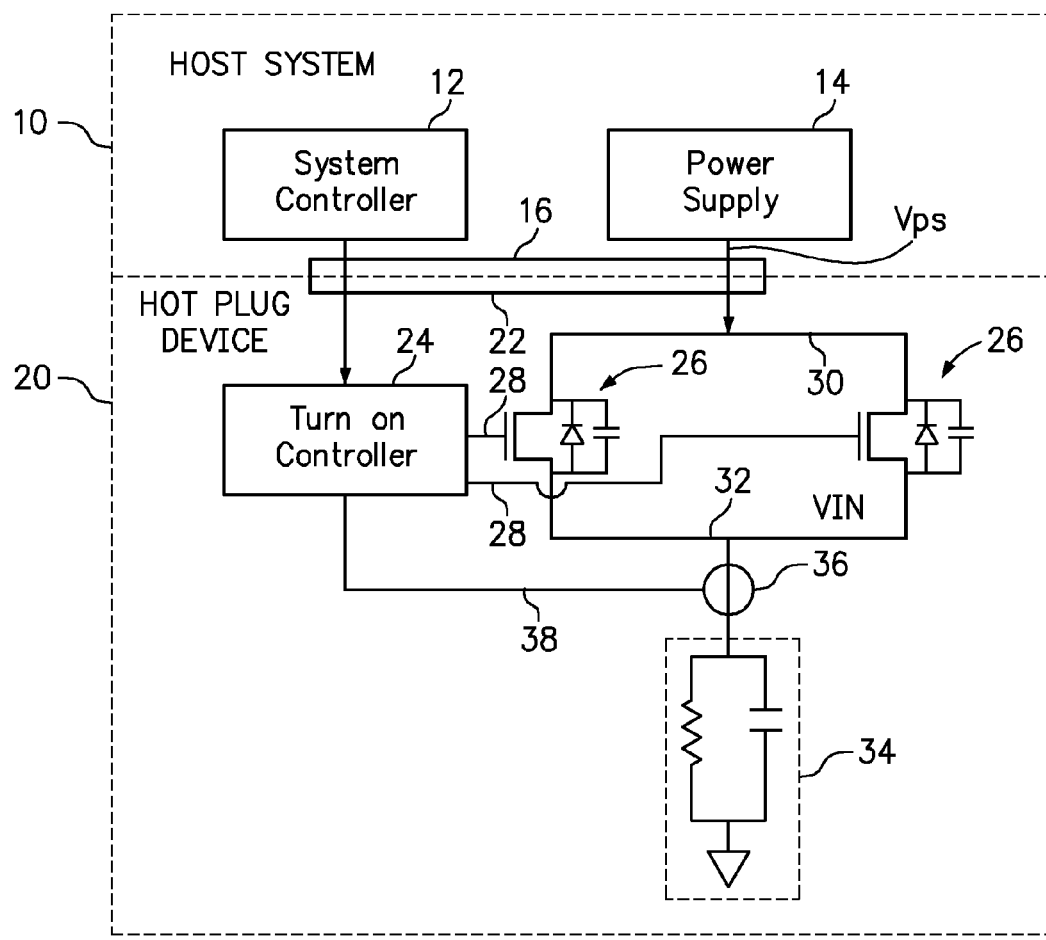
FIG. 1 is a diagram of a hot plug device coupled to a host system.

One embodiment of the present invention provides a method, comprising providing a series of turn on pulses to the gates of a plurality of turn on FETs on a hot plug device coupled to a direct current power source, wherein each pulse causes the plurality of FETs to pass current from the direct current power source to a subsystem of the hot plug device, and wherein each pulse has a duration that ends before the impedance of the turn on FETs falls below a safe operating region. The method further comprises providing a steady turn on signal to the FETs in response to the output voltage from the FETs to a subsystem of the hot plug device exceeding a predetermined voltage threshold.

A hot plug device is an electronic device that can be added to a host system without significant interruption in the operation of the system. A typical hot plug device will have a connector with pins that include an electrical ground, power and any number of signal lines. Accordingly, the physical connection of the hot plug device to the host system puts the hot plug device into communication with a ground wire, a power supply and a signal transmitter, receiver or transceiver.

The hot plug device includes a plurality of turn on FETs that control the flow of electrical current from the power supply to a subsystem of the hot plug device. Preferably, the hot plug device will also include a turn on controller that provides a turn on signal to the gate of each of the turn on FETs. The turn on controller may be in communication with a system controller of the host system, and take steps to turn on the host plug device in response to an instruction from the system controller.

In one option, the method may limit the series of turn on pulses to no more than a predetermined number of turn on pulses. Limiting the series of turn on pulses to no more than a predetermined number of turn on pulses may provide the benefit of preventing damage to the FETs, preventing tripping of the power supply, or both.

In a further option, the method may include providing no further turn on signal to the FETs in response to the output voltage from the FETs to the subsystem of the hot plug device being less than the predetermined voltage threshold after the predetermined number of turn on pulses. In other words, if the output voltage doesn't reach the predetermined voltage by the time the predetermined number of pulses have been provided, then the FETs are turned off. Under these conditions, it is presumed that the hot plug device has an electrical short or low impedance that could damage the FETs or trip the power supply if the FETs were to be fully turned on (i.e., a steady turn on signal to the gates). However, unlike the many existing circuits, the low impedance condition is identified without actually incurring damage to the FETs or tripping the power supply.

Independently, the method may include providing a low impedance alert in response to the output voltage from the FETs to the subsystem of the hot plug device being less than the predetermined voltage threshold after the predetermined number of turn on pulses. Such an alert may serve to provide notice to personnel that the hot plug device is not operational and needs servicing or replacement.

Each of the pulses has a duration that ends before the impedance of the turn on FETs falls below a safe operating region. Accordingly, the impedance of the FET remains high. Preferably, the time between pulses is greater than the RC time constant that is to be supported in the system. For example, a series of pulses to the gate of the FETs may include a number of repeating cycles of 10 milliseconds on, followed by 90 milliseconds off. The on time of the pulse may include any time delay that is needed to start charging the gate on the turn on fets. There is a finite $\Delta V$ that the input rail will rise in $\Delta T$ under a normal impedance profile. The turn off time is chosen such that, based on a minimum resistance on the rail, the RC time constant will not allow rail to rise above predetermined threshold in the predetermined number of pulses. Other duty cycles may be empirically determined to be effective for turning on the hot plug device, yet prevent damage to the FETs when there is an electrical short between the electrical output from the FETs and ground.

According to various embodiments of the invention, a steady turn on signal is not provide to the FETs until and unless the output voltage on a rail from the FETs to a subsystem of the hot plug device exceeds a predetermined voltage threshold. The predetermined voltage threshold is preferably less than a target operating voltage for the hot plug device. In one non-limiting example, the target operating voltage for the hot plug device may be 12 Volts, whereas the predetermined voltage threshold may be about 3 or 4 Volts. The predetermined voltage is chosen such that no other components on the rail will auto initialize, such as fans, auxiliary regulators that must reach a predetermined voltage to turn on. All such components can make the impedance of rail change in a non linear fashion. Resistance in the rail opposes large voltage losses between each pulse. If there is enough resistance in the rail so that the output voltage rises to the predetermined voltage over a series of turn on pulses to the FETs, then it can be assumed that there is no short between the rail and ground. Accordingly, it is determined that it is safe to provide a steady turn on signal to the gate of the FETS so that the voltage on the rail will rise to the target operating voltage.

The method may also include detecting installation of the hot plug device in a host computer, wherein the series of turn on pulses may be provided in response to detecting installation of the hot plug device in a host computer. Alternatively, the series of turn on pulses may be provided in response to a system controller of the host system sending a turn on instruction to a turn on controller of the hot plug device.

Still further, the method may include automatically enabling or turning on one or more component of the hot plug device, such as a fan, in response to the output voltage from the FETs to a subsystem of the hot plug device exceeding a voltage enabling threshold specific to the one or more component.

A further benefit of various embodiments of the invention is that the series of turn on pulses provided to the plurality of turn on FETs can cause or facilitate the hot plug device to reach the turn on voltage with less power dissipation in the FETs than by providing a steady turn on signal to the plurality of turn on FETs.

Another embodiment of the present invention provides a computer program product for controlling in-rush current to a hot plug device. The computer program product comprises a computer readable storage medium having program instructions embodied therewith, where the program instructions are executable by a processor to cause the processor to perform a method. The method comprises providing a series of turn on pulses to the gates of a plurality of turn on FETs on a hot plug device coupled to a direct current power source, wherein each pulse causes the plurality of FETs to pass current from the direct current power source to a subsystem of the hot plug device, and wherein each pulse has a duration that ends before the impedance of the turn on FETs falls below a safe operating region. The method further comprises providing a steady turn on signal to the FETs in response to the output voltage from the FETs to a subsystem of the hot plug device exceeding a predetermined voltage threshold.

The foregoing computer program products may further include program instructions for implementing or initiating any one or more aspects of the methods described herein. Accordingly, a separate description of the methods will not be duplicated in the context of a computer program product.

FIG. 1 is a diagram of a hot plug device 20 coupled to a host system 10. The host system 10 includes a system controller 12 and a power supply 14. A connector 16 may include pins from both the system controller 12 and the power supply 14 for connection to a connector 22 of the hot plug device 20. Accordingly, the connectors 16, 22 provide a connection between the system controller 12 and turn on controller 24 of the hot plug device 20, as well as a connection between the power supply 14 and the input rail 30 that is connected to the turn on FETS 26 of the host plug device 20. In one embodiment, the system controller 12 may be a management module of the host system 10, such as a baseboard management controller, or a field programmable gate array (FPGA).

The turn on controller 24 has outputs 28 coupled to a gate of each of the FETs 26 and provides turn on pulses or signals to the FETs 26. When a turn on signal is being applied to the gate, the FETs 26 allow current from the input rail 30 (originating from power supply 14) to pass through the FETs 26 to the output rail 32. The output rail 32 is, in turn, coupled to a subsystem 34, which is only schematically shown.

A current and/or voltage sensor 36 provides a signal to the turn on controller 24 through a signal line 38. Accordingly, the turn on controller 24 can monitor the current and/or voltage on the output rail 32 in order to determine whether the output voltage from the FETs 26 (i.e., the input voltage to the subsystem 34) has reached a predetermined threshold. In accordance with various embodiments of the invention, the turn on controller 24 initially provides turn on pulses on output lines 28 to the gates of the FETs 26 for a predetermined number of pulses or until the voltage on the output rail 32 reaches the predetermined voltage threshold. If the voltage reaches the predetermined voltage threshold, then the turn on controller 24 will provide a steady turn on signal to lines 28 in order to fully turn on the FETs 26 and allow the voltage in the output rail 32 to reach a target operating voltage for the subsystem 34.

Figure 2:
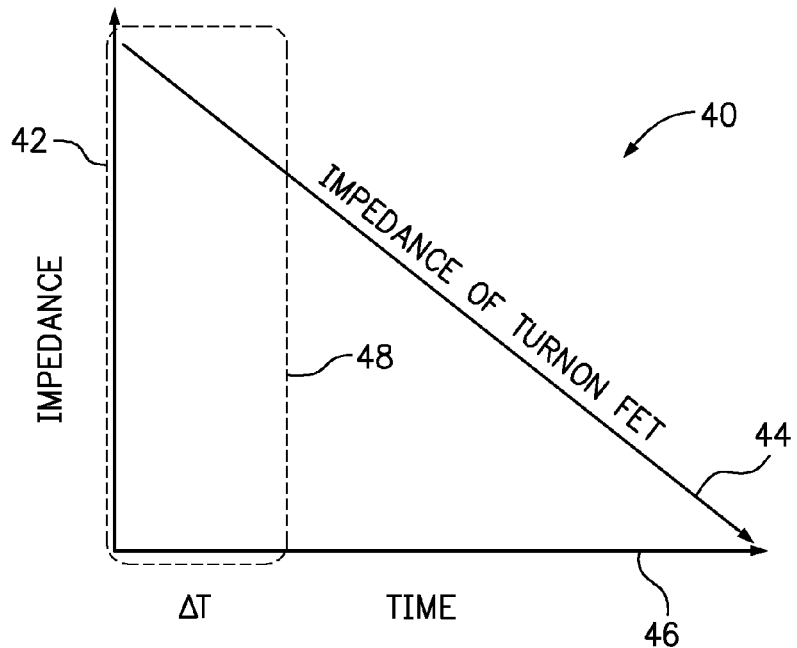
FIG. 2 is a graph illustrating the impedance of a turn on FET over time following a turn on signal to the gate of the FET.

FIG. 2 is a graph 40 illustrating the impedance (y-axis 42) of a turn on FET (points along the line 44) over time (x-axis 46) following a turn on signal to the gate of the FET. During the turn on of the FET, it takes a finite amount of time to turn on. During this turn on time, the impedance of the FET reduces at some linear rate. In this linear region is where most of the power dissipation takes place. Accordingly, it is desirable to spend the least amount of time in this region in order to stay within the safe operating area of the turn on FET. However, some hot plug devices may have a lot of bulk capacitance, such a PCI express device, such that the small turn on times may violate the over current specifications of the rail. According to embodiments of the present invention, it is the goal to operate the turn on FET in a region of higher impedance so that the amount of current that can flow through the FET stays within the safe operating area of FET. During the time $\Delta T$ shown by the dashed block 48 (a pulse), the impedance starts high and begins to decline. However, if the turn on signal is stopped after $\Delta T$, then the FET does not experience the lower impedance shown to the right of the dashed block 48. After a turn off time has passed, another turn on pulse of duration $\Delta T$ will cause the FET to again pass current at the impedance shown within the dashed block 48.

Figure 3:
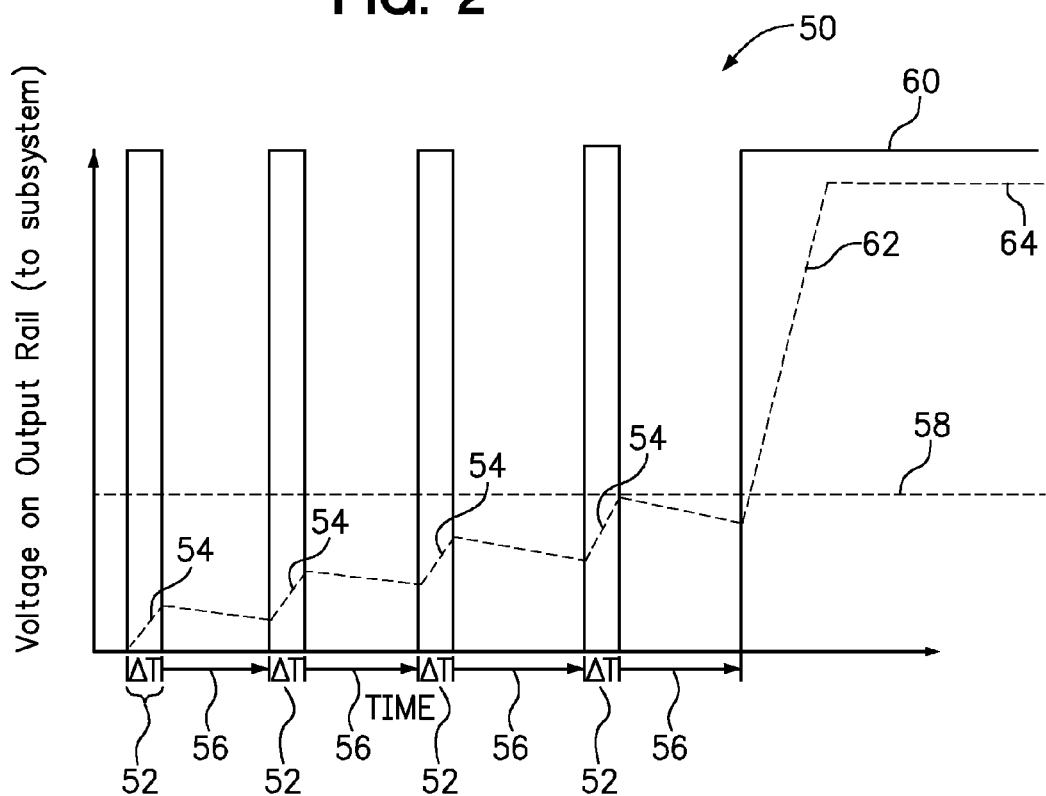
FIG. 3 is a graph illustrating the output voltage from the FETs to a subsystem of a hot plug device.

FIG. 3 is a graph 50 illustrating the output voltage from the FETs to a subsystem of a hot plug device (i.e., the voltage on line 28 in FIG. 1). The pulse duration $\Delta T$ 52 is the amount of time that the turn on FET is in a higher impedance region, and also the delta time that the FET can support a large amount of current within the safe operating area of device. Due to the finite turn on time of the turn on FET, $\Delta T$ can be chosen to let a specific amount of energy into the current path, thus raising the voltage $\Delta V$ in the line 28 to the subsystem (see increased voltage at points 54).

During the turn off time 56 between pulses 52, the voltage will drop according to the time constant of the impedance of the rail (line 28). If the time constant of the rail (a resistor capacitor network) is too small, then the voltage of the rail will never climb. More specifically, if the impedance of the rail is too small, then the voltage will not rise to the voltage threshold 58 within a predetermined number of pulses. However, if the impedance of the rail is sufficient, then the voltage will rise with each pulse until the voltage reaches the voltage threshold 58. Once the voltage reaches the voltage threshold 58, the rail is determined to have sufficient impedance (i.e., no electrical short) that a steady turn on signal 60 can be applied to the gate of the FETs without risking damage to the FETs. Once a steady turn on signal 60 has been provided, the voltage on the rail rises (see region 62) until reaching a target operating voltage 64. On the other hand, if the voltage on the rail does not reach the voltage threshold 58 with a predetermined number of pulses, then it can be determined that there is a low impedance (i.e., a short) on the rail and the FETs should be turned off so that no more current is provided to the hot plug device.

Figure 4:
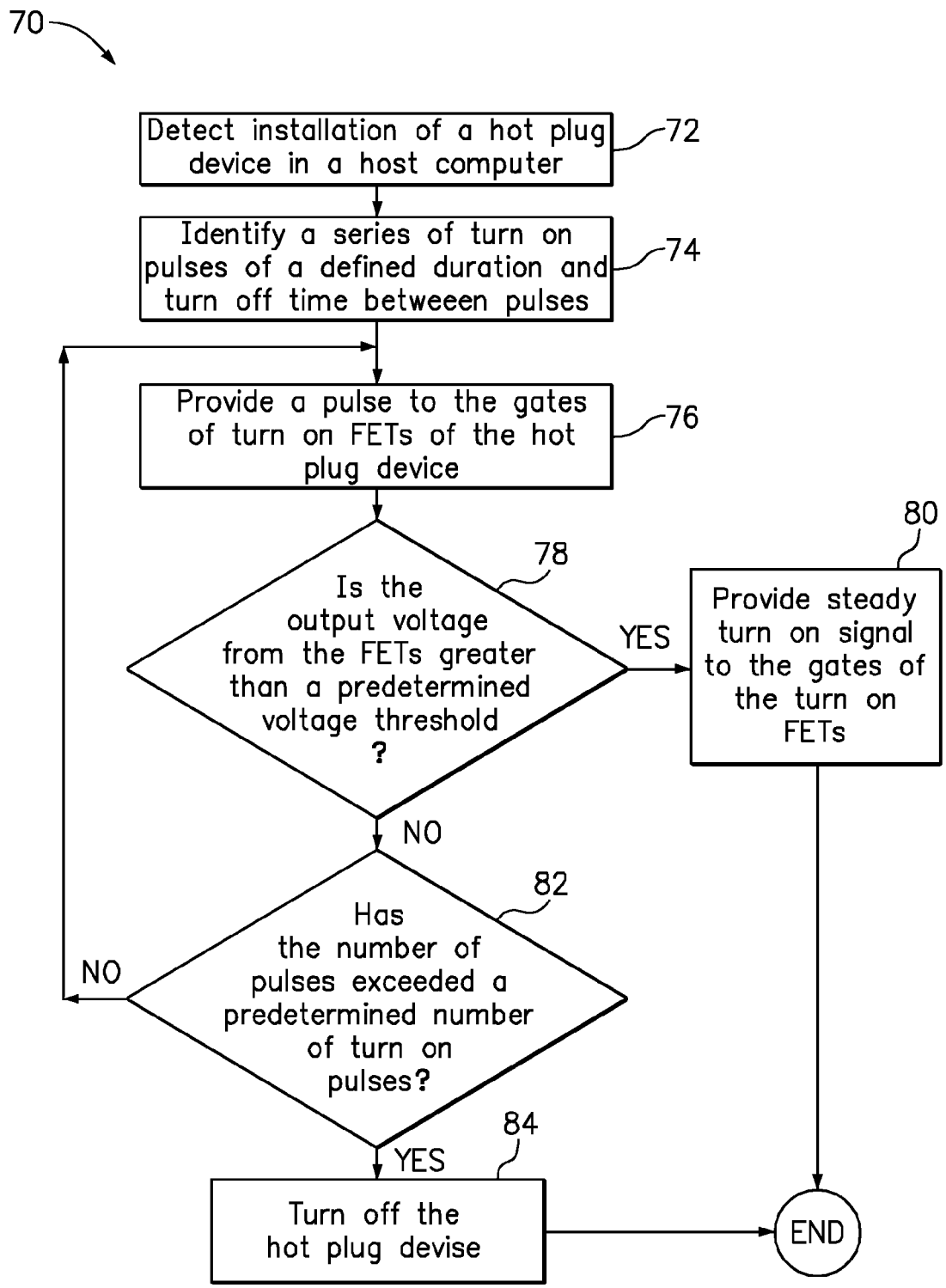
FIG. 4 is a flowchart of a method for controlling the in-rush current to a hot plug device.

FIG. 4 is a flowchart of a method 70 for controlling the in-rush current to a hot plug device. In step 72, the method detects installation of a hot plug device in a host computer. Step 74 then identifies a series of turn on pulses of a defined duration and turn off time between pulses. The duration of turn on pulses and the turn off time between pulses may be stored in memory for use with a particular hot plug device.

In step 76, a pulse is provided to the gates of turn on FETs of the hot plug device. Step 78 determines whether the output voltage from the FETs is greater than a predetermined voltage threshold. A positive determination in step 78 leads to step 80 where the method provides a steady turn on signal to the gates of the turn on FETs. However, a negative determination in step 78 leads to step 82 where the method determines whether the number of pulses has exceeded a predetermined number of turn on pulses. A negative determination in step 82 leads the process to return to step 76 in order to provide the next pulse in the series. However, a positive determination in step 82 leads step 84 where the hot plug device is turned off to avoid damage to the FETs.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method, comprising:
providing a series of turn on pulses to the gates of a plurality of turn on FETs on a hot plug device coupled to a direct current power source, wherein each pulse causes the plurality of FETs to pass current from the direct current power source to a subsystem of the hot plug device, and wherein each pulse has a duration that ends before the impedance of the turn on FETs falls below a safe operating region; and
providing a steady turn on signal to the FETs in response to the output voltage from the FETs to a subsystem of the hot plug device exceeding a predetermined voltage threshold.

2. The method of claim 1, further comprising:
limiting the series of turn on pulses to no more than a predetermined number of turn on pulses.

3. The method of claim 2, wherein limiting the series of turn on pulses to no more than a predetermined number of turn on pulses prevents damage to the FETs.

4. The method of claim 2, wherein limiting the series of turn on pulses to no more than a predetermined number of turn on pulses prevents tripping of the power supply.

5. The method of claim 2, further comprising:
providing no turn on signal to the FETs in response to the output voltage from the FETs to the subsystem of the hot plug device being less than the predetermined voltage threshold after the predetermined number of turn on pulses.

6. The method of claim 2, further comprising:
providing a low impedance alert in response to the output voltage from the FETs to the subsystem of the hot plug device being less than the predetermined voltage threshold after the predetermined number of turn on pulses.

7. The method of claim 1, wherein the time between pulses is greater than the duration of the pulses.

8. The method of claim 1, wherein the predetermined voltage threshold is less than a target operating voltage for the hot plug device.

9. The method of claim 1, further comprising:
detecting installation of the hot plug device in a host computer, wherein the series of turn on pulses are provided in response to detecting installation of the hot plug device in a host computer.

10. The method of claim 1, wherein the hot plug device has a 12 Volt rail coupled between outputs of the FETs and the subsystem of the hot plug device.

11. The method of claim 10, wherein the 12V rail is a capacitor resistor network having a time constant.

12. The method of claim 1, wherein the output voltage from the FETs to a subsystem of the hot plug device increases after each pulse.

13. The method of claim 1, wherein providing the series of turn on pulses to the plurality of turn on FETs cause the hot plug device to reach the turn on voltage with less power dissipation in the FETs than by providing a steady turn on signal to the plurality of turn on FETs.

14. The method of claim 1, further comprising:
monitoring an amount of current through the turn on FETs to a subsystem of the hot plug device.

15. The method of claim 1, further comprising:
automatically enabling one or more component of the hot plug device in response to the output voltage from the FETs to a subsystem of the hot plug device exceeding a voltage enabling threshold specific to the one or more component.

16. The method of claim 15, wherein the one or more component includes a fan.

* * * * *